(12) United States Patent
Hall et al.

(10) Patent No.: US 6,380,769 B1
(45) Date of Patent: Apr. 30, 2002

(54) LOW VOLTAGE OUTPUT DRIVE CIRCUIT

(75) Inventors: Jefferson W. Hall, Phoenix; Jade H. Alberkrack, Tempe, both of AZ (US); Kazuo Ito, Sendai (JP)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/580,560

(22) Filed: May 30, 2000

(51) Int. Cl.$^7$ .................................................. H03B 1/00
(52) U.S. Cl. ........................ 327/112; 327/108; 327/541; 326/87
(58) Field of Search .................................. 327/143, 198, 327/540, 541, 60, 68, 51, 72, 77, 78, 427, 430, 431, 434–437, 108, 112, 538, 543; 326/25, 72, 120, 82, 83, 86, 87, 24; 323/316

(56) References Cited

U.S. PATENT DOCUMENTS

| | | | | |
|---|---|---|---|---|
| 4,142,118 A | * | 2/1979 | Guritz | 327/143 |
| 4,463,273 A | * | 7/1984 | Dingwall | 326/120 |
| 4,590,396 A | * | 5/1986 | Koike | 326/24 |
| 4,612,462 A | * | 9/1986 | Asano et al. | 326/120 |
| 4,697,111 A | * | 9/1987 | Van Zanten et al. | 326/87 |
| 5,144,159 A | * | 9/1992 | Frisch et al. | 327/143 |
| 5,223,754 A | * | 6/1993 | Decker et al. | 327/434 |
| 5,338,988 A | * | 8/1994 | Yamamura et al. | 327/108 |
| 5,369,317 A | * | 11/1994 | Casper et al. | 327/543 |
| 5,631,579 A | * | 5/1997 | Miki et al. | 326/83 |
| 5,874,840 A | * | 2/1999 | Bonaccio | 327/51 |
| 5,889,430 A | * | 3/1999 | Csanky | 327/543 |
| 5,910,924 A | * | 6/1999 | Tanaka et al. | 327/543 |

* cited by examiner

*Primary Examiner*—Toan Tran
*Assistant Examiner*—Long Nguyen

(57) ABSTRACT

A trigger circuit (22) having a depletion mode n-type transistor (32) and a depletion mode p-type transistor (34) operate by having each gate thereof driven by an independent source. When both transistors are on, the depletion mode n-type transistor (32) is driven by $I_{s1}$ to Vsupply and the depletion mode p-type transistor (34) is driven by $I_{s2}$ to ground. When both transistors are off, a transistor (26) is switched on driving $I_{s1}$ to ground, and a transistor (28) is switched on driving the gate of depletion mode p-type transistor (34) to Vsupply. A linear regulator (50) using a depletion mode transistor pair (52, 54) with their gates thereof driven by separate sources provides a low voltage operation with minimal current leakage. One depletion mode transistor (52) is an n-type, and the second depletion mode transistor (54) is a p-type transistor.

10 Claims, 4 Drawing Sheets

Prior Art Linear Regulator

Linear Regulator

LOW VOLTAGE OUTPUT DRIVE CIRCUIT

BACKGROUND OF THE INVENTION

The present invention relates in general to electronic circuits and, more particularly, to depletion mode metal oxide semiconductor (MOS) devices in a series configuration.

Supervisor circuits find use in most if not all system supervisor applications. Systems requiring supervisor circuits are diverse and cover a wide range of uses from battery-powered equipment, computers, embedded systems, and microprocessor power supply monitoring. The supervisor circuit monitors a supply voltage and provides a reset signal to the microprocessor in the presence of a low supply voltage. If the supply voltage falls below some specified operating threshold the supervisor circuit triggers a reset of the microprocessor.

Typically, the supervisor circuit consist of a comparator to monitor changes in the supply voltage, and a trigger circuit to reset the microprocessor upon a supply voltage drop. If the comparator detects a change in supply voltage with respect to a voltage reference, the comparator sends a signal to the trigger circuit to reset the microprocessor.

As an example, a supervisor circuit monitors the supply voltage line of a microprocessor and compares the supply voltage to a voltage reference. If the supply voltage to the microprocessor drops below the voltage reference the supervisor circuit detects the voltage drop and resets the microprocessor, and puts the microprocessor in a fault mode. The microprocessor stays in the fault mode until the supply voltage increases above the voltage reference, at which time the supervisor circuit removes the reset and the microprocessor thereafter operates in a normal mode.

The output of current prior art supervisor circuits have a state at which it can not guarantee an output if the supply voltage drops below some threshold voltage. The point below the threshold voltage at which the output of the supervisor circuit is not guaranteed is dependent upon the minimum voltage required to operate the trigger circuit. Typical implementations of a trigger circuit in the prior art are open drain or complimentary transistor configurations. Both of these configurations require a minimum voltage to be applied to the devices before the devices are operative. As a result, if the supply voltage to the microprocessor drops below the minimum voltage required to operate the trigger circuit, the output of the supervisor circuit can not be guaranteed and the microprocessor may inadvertently fall out of a fault mode. Also, for low voltage applications the supply voltage may operate close to the minimum voltage required to operate the trigger circuit, again resulting in an operation where the microprocessor may fall out of a fault mode.

Low voltage applications typically require linear regulators. A linear regulator takes in an unregulated input voltage and converts it to a regulated output voltage. The prior art typically uses an enhancement mode p-type transistor and a controller to provide the regulation. When the enhancement mode p-type transistor is turned off by the controller, there is some leakage current through the enhancement mode p-type transistor. The leakage current is typically inversely related to the threshold voltage of the enhancement mode p-type transistor. Thus, you have to make the threshold voltage of the enhancement mode p-type transistor higher to reduce the leakage current. However, the input voltage must be at least the threshold voltage of the enhancement mode p-type transistor to turn the linear regulator on. Therefore, to operate a linear regulator at a low voltage results in a high leakage current through the device.

With advancing technology, most supply voltages to systems will drop down to the minimum voltage required to operate current prior art enhancement mode devices. For example, if the supply voltage of a microprocessor operates close to the minimum voltage required to operate the trigger circuit the microprocessor may experience inadvertent fault or operating modes. Furthermore, it would not be possible for a system to have a linear regulator operate at a low voltage with little or no leakage current using prior art enhancement mode devices. Thus, to meet advancing technology, a need exists for a circuit which can operate close to zero volts to replace trigger circuits presently used in prior art supervisor circuits to guarantee an output of the supervisor circuit for all input voltage levels. Also, the circuit must provide a linear regulator to operate in a low voltage environment without a high leakage current as seen with current prior art technology.

DETAILED DESCRIPTION OF THE PREFERED EMBODIMENT

Figure 1:
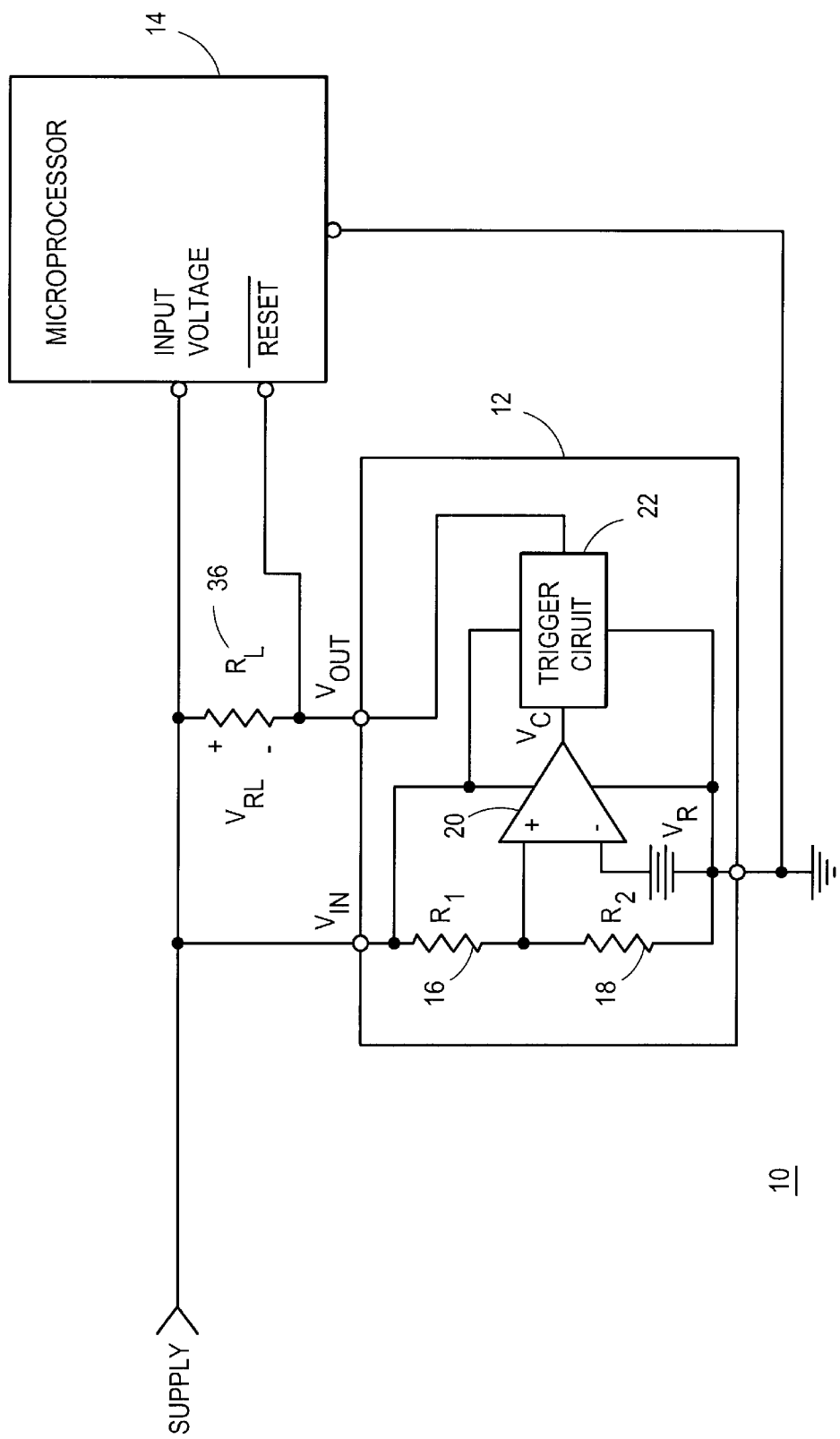
FIG. 1 is a block diagram of a supervisor circuit and microprocessor.

FIG. 1 illustrates one embodiment of system supervisor 10. Specifically, system supervisor 10 has supervisor circuit 12 to monitor a supply voltage line (Vsupply) of microprocessor 14. If Vsupply drops below the minimum operating voltage of microprocessor 14, e.g. reset voltage threshold, microprocessor 14 is shut down via a reset signal sent by supervisor circuit 12. Upon reset, microprocessor 14 stays in a fault mode until Vsupply increases above the reset voltage threshold for microprocessor 14.

In particular, Vsupply is monitored at the input voltage (Vin) of supervisor circuit 12. A voltage divider network receives the voltage at Vin and reduces the voltage by a ratio of resistor 16 and resistor 18. The reduced voltage is applied to the positive terminal of comparator 20. A reference voltage (Vref) is applied to the negative terminal of comparator 20. The reference voltage and resistor divider ratio are chosen based on the reset voltage threshold of microprocessor 14. If the voltage at the positive terminal of comparator 20 drops below Vref at the negative terminal of comparator 20, an output signal (Vc) is sent to trigger circuit 22. Upon receiving the signal from comparator 20, trigger circuit 22 turns on, driving current through RL which provides a reset signal to microprocessor 14. Once microprocessor 14 receives the reset signal it falls into a fault mode. Microprocessor 14 stays in the fault mode until Vsupply increases above the reset voltage threshold required for microprocessor 14 to operate in a normal mode.

Figure 2:
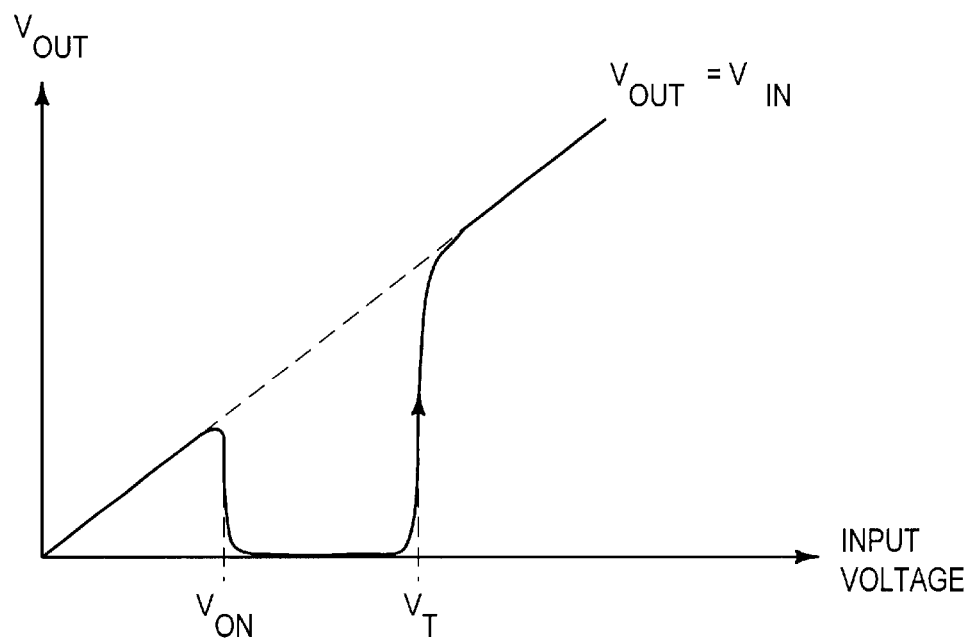
FIG. 2 is a waveform plot of an output signal of a prior art supervisor circuit.
Figure 3:
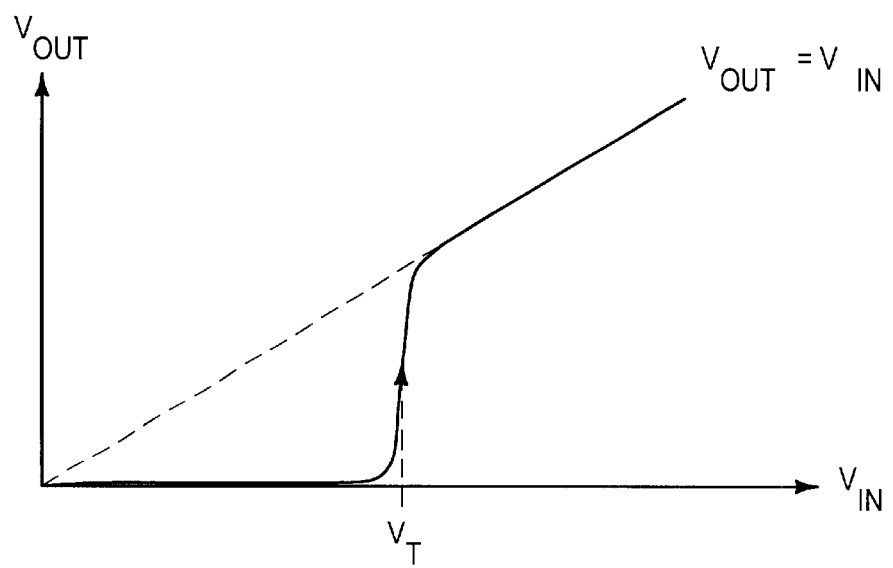
FIG. 3 is a waveform plot of an output signal of a supervisor circuit.

FIG. 2 illustrates a plot of the transfer function of output voltage versus input voltage of a prior art supervisor circuit. FIG. 3 illustrates a plot of the transfer function of output voltage versus input voltage of supervisor circuit 12. In the prior art, a major problem with supervisor circuits is that the output voltage follows the input voltage when the input voltage is below some voltage Von. As a result as illustrated in FIG. 2, a prior art supervisor circuit does not have a guaranteed output for an input voltage less than Von. Voltage level Von is representative of the voltage necessary to guarantee turn on of a trigger circuit of a prior art supervisor circuit.

The plot of the transfer function of output voltage versus input voltage of a supervisor circuit in FIG. 3 requires no minimum voltage to operate the trigger circuit. Thus, the supervisor circuit in FIG. 3 guarantees an output voltage for all input voltage levels to the supervisor circuit.

Figure 4:
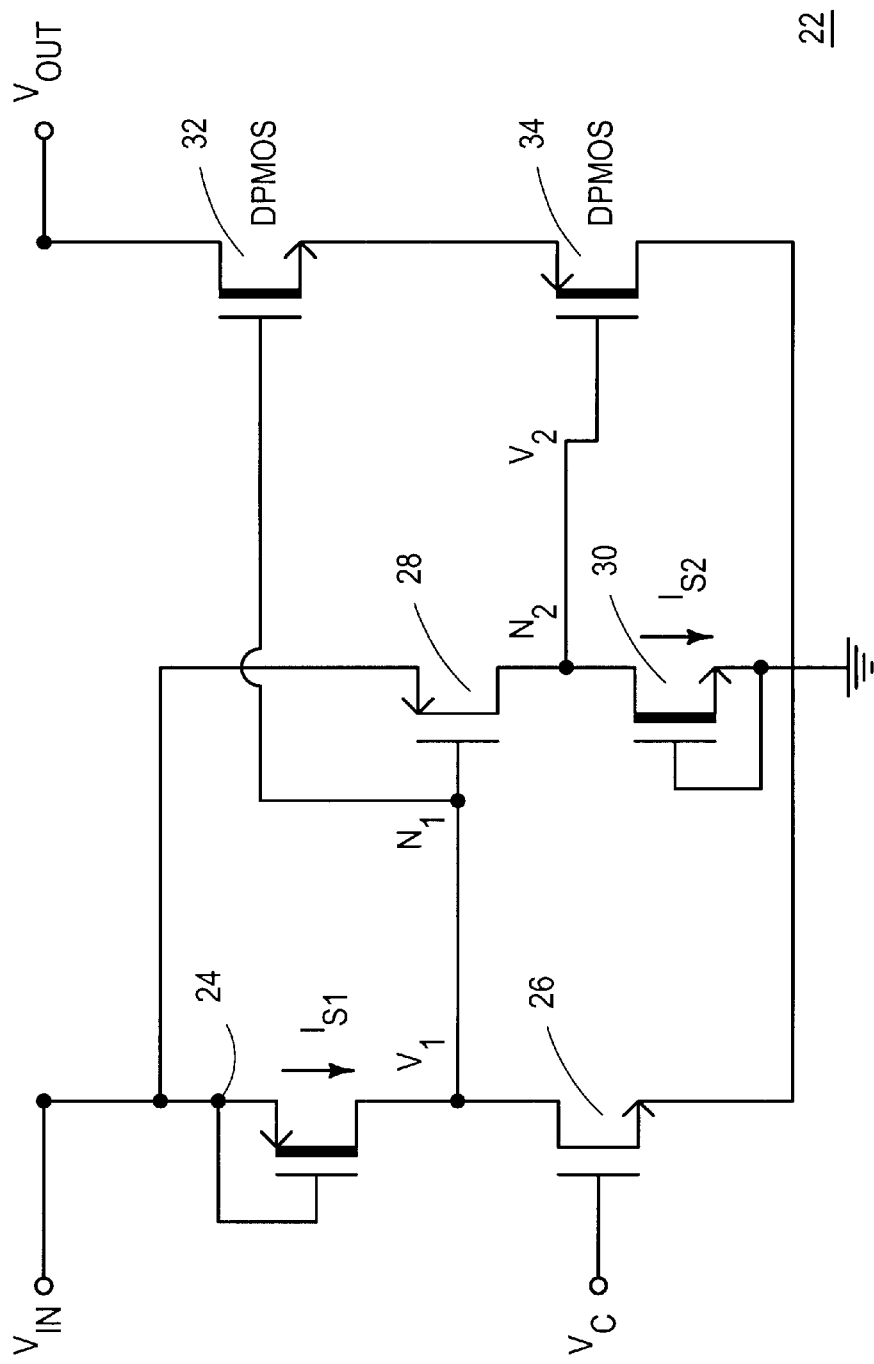
FIG. 4 is a schematic diagram of a trigger circuit of the supervisor circuit.

FIG. 4 illustrates trigger circuit 22 of supervisor circuit 12. Transistor 24 is a depletion mode transistor connected in a current source configuration to supply a small current $I_{s1}$. Transistor 24 has a source coupled to Vin to receive a voltage level, Vsupply, a gate connected to the source of transistor 24, and a drain to supply $I_{s1}$. Transistor 26 is an enhancement mode transistor, and receives a control signal (Vc) to switch transistor 26 on and off with the output of comparator 20. Transistor 26 has a drain coupled to the drain of transistor 24 to receive $I_{s1}$, a gate coupled to Vc from comparator 20, and a source coupled to ground. Transistor 28 is an enhancement mode transistor, and switches on and off in response to Vc. Transistor 28 has a source coupled to receive Vsupply at Vin, a gate coupled to the drain of transistor 26, and a drain coupled to the drain of transistor 30. Transistor 30 is a depletion mode transistor connected in a current sink configuration to supply small current $I_{s2}$. Transistor 30 has a drain coupled to the drain of transistor 28, a gate connected to the source of transistor 30, and a source coupled to ground. Transistor 32 is a depletion mode n-type transistor with a drain coupled to Vout of trigger circuit 22, and a gate coupled to the gate of transistor 28. Transistor 34 is a depletion mode p-type transistor with a source coupled to the source of transistor 32, a gate coupled to the drain of transistor 28, and a drain coupled to ground.

Trigger circuits used in the prior art typically consist of an inverter configuration with enhancement mode devices. FIG. 2 illustrates that a minimum voltage, Von, is required in the prior art to operate the enhancement mode devices used in trigger circuits. The trigger circuit of FIG. 4 uses the depletion mode transistor pair 32, 34 to eliminate the requirement for a minimum Von. In fact, using the depletion mode transistor pair 32, 34 in a trigger circuit provides down to a zero volt operation of a supervisor circuit.

In typical operation, trigger circuit 22 operates in one of two states. If Vsupply drops below the reset voltage threshold of microprocessor 14, the voltage at the positive terminal of comparator 20 drops below VR at the negative terminal of comparator 20 and the output of comparator 20 goes low. A low output at Vc turns off transistor 26 causing drive current $I_{s1}$ to charge the gate of depletion mode n-type transistor 32 pulling the gate voltage to Vsupply keeping transistor 32 on. Transistor 28 turns off, allowing current $I_{s2}$ to pull the gate of transistor 34 to ground keeping depletion mode p-type transistor 34 on. A current develops through load resistor 36 which creates a voltage drop $V_{RL}$ that is subtracted from Vsupply to provide a low output voltage at $V_{OUT}$ of supervisor circuit 12. A low output at $V_{OUT}$ of supervisor circuit 12 resets microprocessor 14 and puts microprocessor 14 in fault mode.

If Vsupply is above the reset voltage threshold of microprocessor 14, then the voltage at the positive terminal of comparator 20 is greater than Vref at the negative terminal of comparator 20 and the output of comparator 20 goes high. A high output at Vc turns on transistor 26 effectively driving current $I_{s1}$ and the gate of transistor 32 to ground, turning transistor 32 off. Transistor 28 turns on and drives current $I_{s2}$ from Vsupply to ground setting the voltage at the gate of depletion mode p-type transistor 34 to $V_{IN}$ which turns depletion mode p-type transistor 34 off. A high output at $V_{OUT}$ of supervisor circuit 12 removes the reset from microprocessor 14 and puts microprocessor 14 in normal mode.

Depletion mode n-type transistor 32 and depletion mode p-type transistor 34 are driven by separate and independent control signals. To operate both of the depletion mode devices independently requires that each gate thereof be driven by a separate source. Referring to FIG. 4, the gate of depletion mode n-type transistor 32 is driven by control signal Vc1 at node N1, and the gate of depletion mode p-type transistor 34 is driven by control signal Vc2 at node N2. Node N1 and N2 are separate and distinct sources supplying separate and distinct control signals. There is no necessary relationship between Vc1 and Vc2.

To reset microprocessor 14, both depletion mode transistors are switched on. To switch both depletion mode transistors on, depletion mode n-type transistor 32 is driven by $I_{s1}$ at node N1 to Vsupply and depletion mode p-type transistor 34 is driven by $I_{s2}$ at node N2 to ground. To remove the reset from microprocessor 14, both depletion mode transistors are switched off. To switch both depletion mode transistors off, transistor 26 is switched on driving $I_{s1}$ at node N1 to ground resulting in zero volts applied to the gate of depletion mode n-type transistor 32, and transistor 28 is switched on driving node N2 and the gate of depletion mode p-type transistor 34 to Vsupply.

Figure 5:
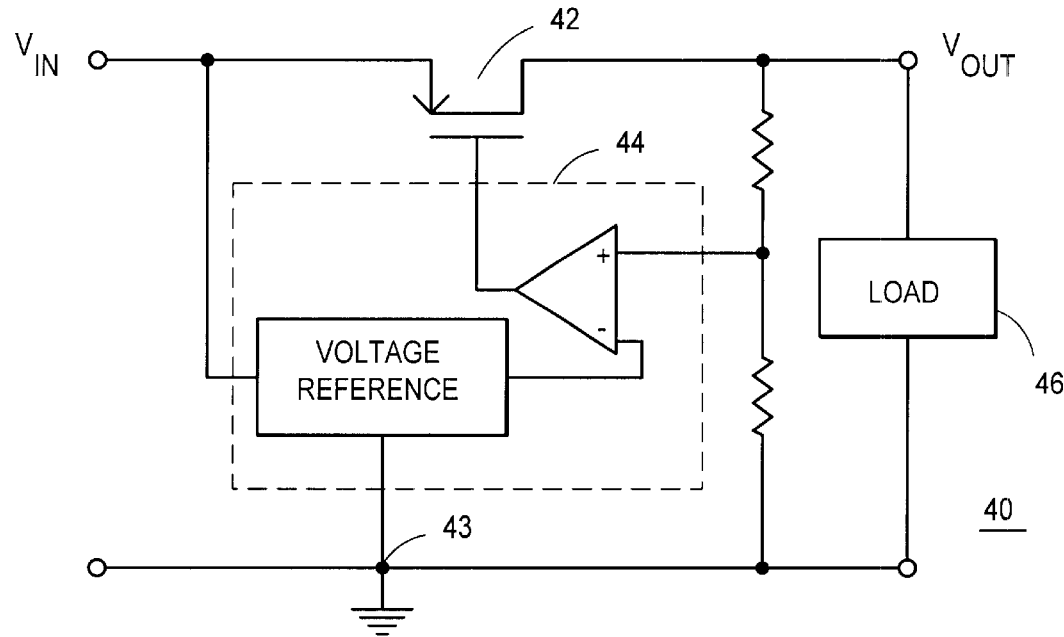
FIG. 5 is a block diagram of a prior art linear regulator circuit.

FIG. 5 illustrates prior art linear regulator 40 using enhancement mode p-type transistor 42. Linear regulator 40 takes in an unregulated input voltage at $V_{IN}$ and converts it to a regulated output voltage provided at $V_{OUT}$, and supplies a current at the regulated output voltage to load 46. Enhancement mode p-type transistor 42 has a gate voltage which is varied between $V_{IN}$ and ground potential 43 by controller 44. During operation, when prior art enhancement mode p-type transistor 42 is turned off by controller 44, a leakage current develops through enhancement mode p-type transistor 42. Typically, to reduce the leakage current, a larger threshold voltage for enhancement mode p-type transistor 42 is chosen to reduce the leakage current created at a zero gate to source voltage. However, the prior art poses the problem that as the threshold voltage is increased to compensate for the leakage current, $V_{IN}$ must be at least the threshold voltage of enhancement mode p-type transistor 42 to turn linear regulator 40 on.

FIG. 4 illustrated an application using two depletion mode transistors, one n-type transistor and one p-type transistor with both transistors connected in series. The two depletion mode transistors have separate and distinct control signals applied to the gates thereof in a digital manner by a controller. In another application, two depletion mode transistors are controlled using separate and distinct control signals in an analog manner as explained forthcoming.

Figure 6:
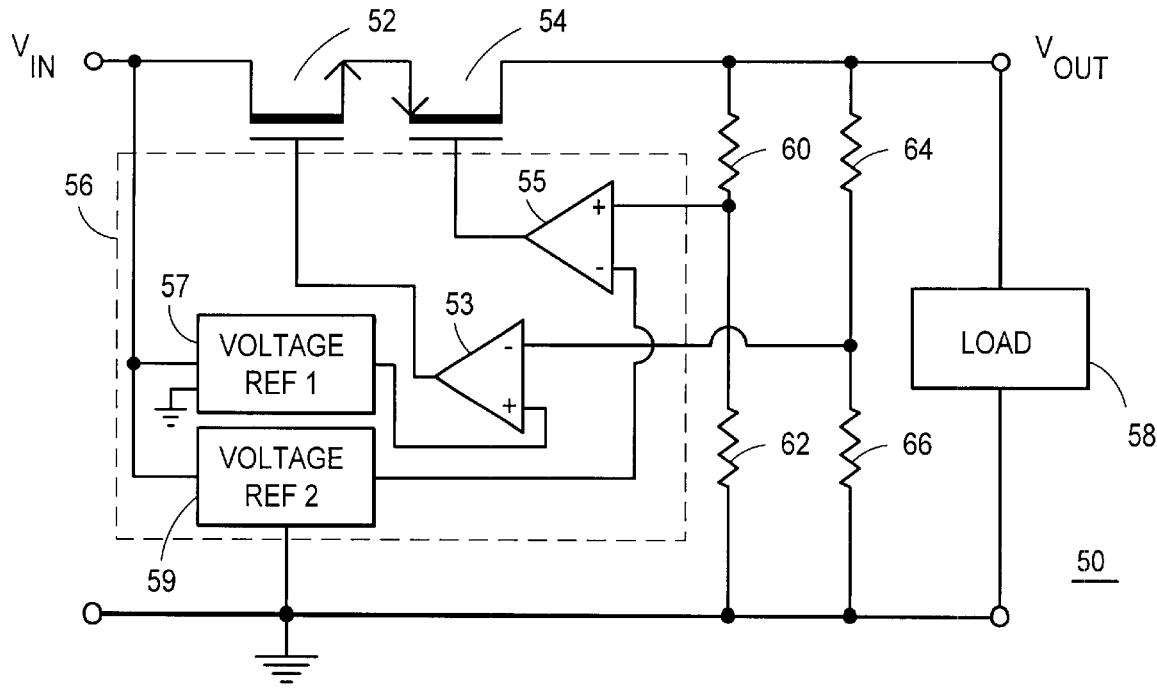
FIG. 6 is a block diagram of a linear regulator circuit.

FIG. 6 illustrates linear regulator 50 using depletion mode transistor pair 52, 54 connected in series. Depletion mode transistor 52 is an n-type depletion mode transistor, and depletion mode transistor 54 is a p-type depletion mode transistor. Linear regulator 50 takes in an unregulated input voltage at $V_{IN}$ and converts it to a regulated output voltage provided at $V_{OUT}$, and supplies a current at the regulated output voltage to load 58. Controller 56 provides separate and independently controlled signals to the gates of each transistor thereof in an analog manner.

An n-type transistor by its physical characteristics typically has a lower current leakage than a p-type transistor. Using n-type depletion mode transistor 52 at the input, Vin, of linear regulator 50 controls leakage current thereof. Also, depletion mode transistors by their inherent characteristic have a negative voltage threshold and as a result can operate at very low voltages. Linear regulator 50 uses the aforementioned characteristics of depletion mode transistors to provide regulation between $V_{IN}$ and $V_{OUT}$ at a low operating voltage without compromising leakage current.

Controller 56 provides continuous analog voltages, between zero volts and $V_{IN}$, to the gates of depletion mode transistor 52, and depletion mode transistor 54 to modulate the voltage at load 58, based on current at load 58. Depletion mode transistor 52, and depletion mode transistor 54 are driven by separate and independent control signals at the gates thereof by controller 56 to provide the load current necessary to regulate $V_{OUT}$. To operate both of the depletion mode devices independently requires that each gate thereof be driven by a separate source. Referring to FIG. 6, the gate of depletion mode n-type transistor 52 is driven by control signal Vc3, and the gate of depletion mode p-type transistor 54 is driven by control signal Vc4. Control signals Vc3 and Vc4 are separate and distinct sources supplying separate and distinct control signals. There is no necessary relationship between Vc3 and Vc4.

Controller 56 includes amplifier 53 having a negative terminal connected between resistor 66 and resistor 64, a positive terminal connected to voltage reference 57, and an output connected to the gate of depletion mode transistor 52. Amplifier 55 has a positive terminal connected between resistor 60 and resistor 62, a negative terminal connected to a second voltage reference 59, and an output connected to the gate of depletion mode transistor 54. Resistors 60, 62, 64, and resistor 66 provide the necessary feedback information for controller 56.

In summary, a trigger circuit with the operation shown in FIG. 3 is illustrated to provide a guaranteed output for all input voltages down to zero volts. The trigger circuit is used within a supervisor circuit to monitor a microprocessor even if the operating voltage to the supervisor circuit drops to zero volts. In typical operation, if the operating voltage to a microprocessor drops below the reset voltage threshold of the microprocessor, which may be close to zero volts, the trigger circuit provides a reset signal to the microprocessor. When the operating voltage increases above the reset voltage threshold the trigger circuit removes the reset signal to the microprocessor. The trigger circuit consist of a depletion mode n-type and p-type transistor pair with their gates thereof driven by separate sources. The depletion mode n-type and p-type transistor pair are driven by separate sources to operate the transistor pair thereof out of phase to provide a logic function down to zero volts where the present art fails.

Furthermore, a linear regulator is shown in FIG. 6 with a depletion mode n-type and p-type transistor pair with their gates thereof driven by separate and distinct sources to provide a low voltage operation with minimal current leakage. The embodiment of FIG. 6 provides linear regulation for low voltage applications without compromise of leakage current. Having the n-type depletion mode transistor connected to $V_{IN}$ further provides a low leakage current operation.

What is claimed is:

1. A circuit, comprising:
   a first depletion mode transistor of a first conductivity type having a control terminal coupled for receiving a first drive signal and a first conduction terminal coupled to a reference terminal of the circuit; and
   a second depletion mode transistor of a second conductivity type, having a control terminal coupled for receiving a second drive signal separate from the first drive signal, a first conduction terminal coupled to an output terminal of the circuit, a second conduction terminal coupled to a second conduction terminal of the first depletion mode transistor.

2. The circuit of claim 1 further including:
   a first current source having an output for providing a first current referenced to a voltage supply; and
   a third transistor having a control terminal coupled for receiving a control signal, a first conduction terminal coupled to the reference terminal, and a second conduction terminal coupled to the output of the first current source for providing the second drive signal.

3. The circuit of claim 2 further including:
   a second current source(30) having an output for providing a second current; and
   a fourth transistor(28) having a control terminal coupled to the output of the first current source(24), a first conduction terminal coupled for receiving the voltage supply, and a second conduction terminal coupled to the output of the second current source(30) for providing the first drive signal.

4. The circuit of claim 3 further including a comparator (20) having a first input coupled for receiving the voltage supply and a second input coupled for receiving a reference voltage and an output for providing the control signal.

5. The circuit of claim 1 wherein the first depletion mode transistor(34) is a p-channel device and the second depletion mode transistor(32) is an n-channel device having a source coupled to the source of the p-channel device.

6. In a system, a supervisor circuit for providing a reset signal within the system in response to a voltage supply to the system, the supervisor circuit, comprising:
   a detector circuit for monitoring the voltage supply and providing first and second control signals when the voltage supply falls below a predetermined value;
   a first depletion mode transistor(34) having a control terminal coupled for receiving the first control signal and a first conduction terminal coupled to a first terminal of the supervisor circuit; and
   a second depletion mode transistor(32) having a control terminal coupled for receiving the second control signal, a first conduction terminal coupled to a second terminal of the supervisor circuit, a second conduction terminal coupled to a second conduction terminal of the first depletion mode transistor(34).

7. The detector circuit of claim 6 further including:
   a first current source(24) having an output referenced to the voltage supply; and
   a third transistor(26) having a control terminal coupled for receiving a control signal, a first conduction terminal coupled to a first output terminal(gnd), and a second conduction terminal coupled to the output of the first current source(24) for providing the second control signal.

8. The detector circuit of claim 6 further including:
   a second current source(30); and
   a fourth transistor(28) having a control terminal coupled to the output of the first current source(24), a first conduction terminal coupled for receiving the voltage supply, and a second conduction terminal coupled to the output of the second current source(30) for providing the first control signal.

9. The detector circuit of claim 8 further including a comparator(20) having a first input coupled for receiving the voltage supply and a second input coupled for receiving a reference voltage and an output for providing the control signal.

10. The supervisor circuit of claim 6 wherein the first depletion mode transistor(34) is a p-channel device and the second depletion mode transistor(32) is an n-channel device having a source coupled to the source of the p-channel device.

* * * * *